United States Patent [19]
Hergenrother et al.

[11] Patent Number: 6,027,975
[45] Date of Patent: Feb. 22, 2000

[54] PROCESS FOR FABRICATING VERTICAL TRANSISTORS

[75] Inventors: John M. Hergenrother, Short Hills; Donald Paul Monroe, Berkeley Heights, both of N.J.

[73] Assignee: Lucent Technologies Inc., Murray Hill, N.J.

[21] Appl. No.: 09/143,274

[22] Filed: Aug. 28, 1998

[51] Int. Cl.$^7$ .................................................. H01L 21/336
[52] U.S. Cl. .......................................... 438/268; 438/138
[58] Field of Search .................................... 438/309, 137, 438/138, 197, 206, 212, 267, 268, 269

[56] References Cited

U.S. PATENT DOCUMENTS

| | | | |
|---|---|---|---|
| 4,670,768 | 6/1987 | Sunami et al. | 438/268 |
| 5,733,811 | 3/1998 | Yamazaki | 438/275 |
| 5,872,037 | 2/1999 | Iwamatsu et al. | 438/268 |
| 5,918,155 | 6/1999 | Kikuchi et al. | 438/138 |
| 5,943,574 | 8/1999 | Tehrani et al. | 438/300 |

OTHER PUBLICATIONS

*IEEE Transactions on Electron Devices*, vol. 38, No. 3, "Impact of Surrounding Gate Transistor (SGT) for Ultra–High–Density LSI's", H. Takato et al., pp. 573–577, Mar. 1991.

*IEEE Transactions on Electron Devices*, vol. 42, No. 12, "Impact of a Vertical Φ–Shape Transistor (VΦT) Cell for 1 Gbit DRAM and Beyond", S. Maeda et al., pp. 2117–2123, Dec. 1995.

*Solid State Technology*, "Nano–MOSFETs for Future ULSI Application", A. Strass, pp. 65–74, Jan. 1996.

*IEDM*, "Sub–50 NM Gate Length N–Mosfets With 10 NM Phosphorus Source And Drain Junctions", M. Ono et al., pp. 6.2.1–6.2.4, 1993.

*IEDM*, "An SPDD P–Mosfet Structure Suitable For 0.1 and Sub 0.1 Micron Channel Length and its Electrical Characteristics", M. Saito, et al., pp. 35.5.1–35.5.4, 1992.

*54$^{th}$ Device Research Conference*, "Vertical, Fully–Depleted, Surrounding Gate Mosfets on sub–0.1 μm Thick Silicon Pillars", C. Auth et al., pp. 108–109, Jun. 24–26, 1996.

*Primary Examiner*—Tuan H. Nguyen
*Attorney, Agent, or Firm*—Richard J. Botos

[57] ABSTRACT

A process for fabricating a vertical MOSFET device for use in integrated circuits is disclosed. In the process, at least three layers of material are formed sequentially on a semiconductor substrate. The three layers are arranged such that the second layer is interposed between the first and third layers. The second layer is sacrificial, that is, the layer is completely removed during subsequent processing. The thickness of the second layer defines the physical gate length of the vertical MOSFET. In the process the first and third layers have etch rates that are significantly lower than the etch rate of the second layer in an etchant selected to remove the second layer.

After the at least three layers of material are formed on the substrate, a window or trench is formed in the layers. The window terminates at the surface of the silicon substrate in which one of either a source or drain region is formed in the silicon substrate. The window or trench is then filled with a semiconductor material. This semiconductor plug becomes the vertical channel of the transistor. Therefore the crystalline semiconductor plug is doped to form a source extension, a drain extension, and a channel region in the plug. Subsequent processing forms the other of a source or drain on top of the vertical channel and removes the sacrificial second material layer. The removal of the sacrificial second layer exposes a portion of the doped semiconductor plug. The device gate dielectric is then formed on the exposed portion of the doped semiconductor plug. The gate electrode is then deposited. The physical gate length of the resulting device corresponds to the deposited thickness of the second material layer.

25 Claims, 7 Drawing Sheets

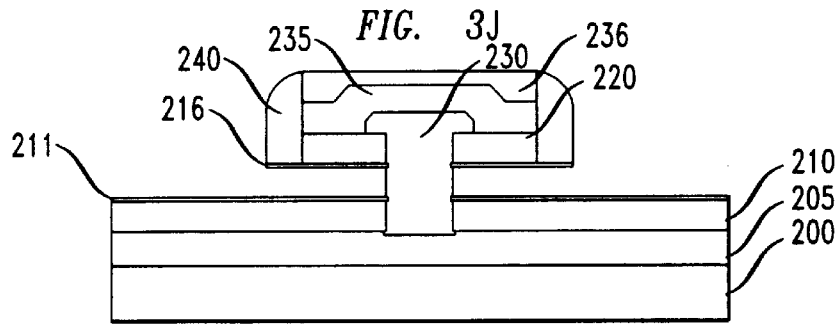
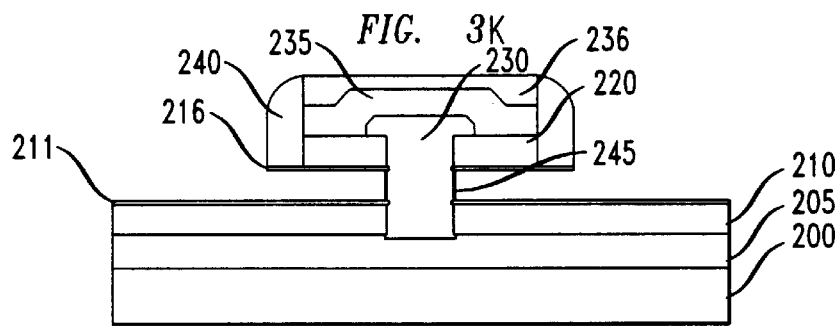
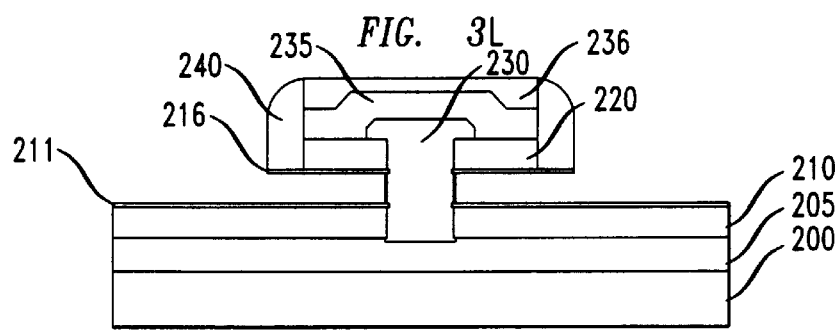
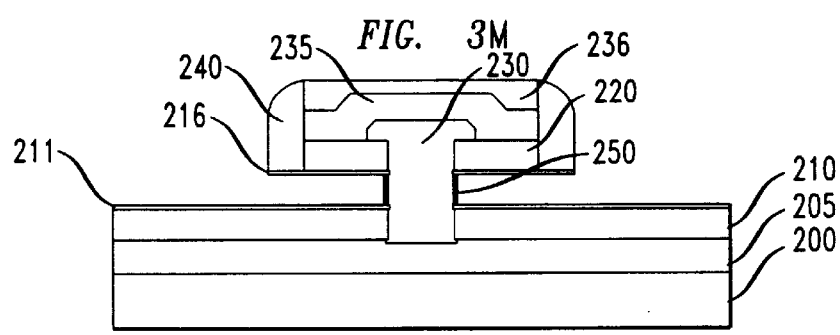

PROCESS FOR FABRICATING VERTICAL TRANSISTORS

BACKGROUND OF THE INVENTION

1. Technical Field

The present invention is directed to a process for fabricating vertical transistors.

2. Art Background

In integrated circuits, there is a trend toward a higher device density to increase the number of devices per unit area. Device density is increased by making individual devices smaller and placing the devices closer together. Device dimensions (termed feature size or design rules) are decreasing from 0.25 µm to 0.18 µm and beyond. It is also desired to decrease the distance between devices in a commensurate fashion.

Currently, most MOS (metal oxide semiconductor) transistors have a planar configuration. In a planar MOS device, the direction of the current flow is parallel to the plane of the substrate surface. Although there is a need to decrease the size of these devices to achieve increased device density, fabricating these small devices becomes increasingly difficult. In particular, lithography becomes extremely difficult as device dimensions decrease to less than the wavelength of the radiation used to delineate an image of a pattern in a radiation-sensitive material.

A vertical device configuration, described in Takato, H., et al., "Impact of Surrounding Gate Transistor (SGT) for Ultra-High-Density LSI's" *IEEE Transactions on Electron Devices*, Vol. 38 (3), pp. 573–577 (1991) has been proposed as an alternative to the more space-consuming planar device configuration. A schematic of the device is illustrated in FIG. 1. The device 10 has a source 15, drain 20, and channel 25. The length of the channel 25 is perpendicular to the surface of the substrate 30 on which the device 10 is formed. The device is called a vertical transistor because the length of the channel is perpendicular to the substrate surface. A gate 35 surrounds the channel 25.

Although vertical MOSFETs (metal oxide semiconductor field effect transistors) can be packed more densely than planar MOSFETs, the processing issues for the vertical transistors are not trivial. A process that makes it easier and more efficient to fabricate vertical MOSFETs is therefore desired.

SUMMARY OF THE INVENTION

The present invention is directed to a process for fabricating a vertical MOSFET. In the process, a first layer of an electrically insulating material, e.g. silicon nitride ($Si_3N_4$), is formed on a semiconductor substrate. Examples of suitable semiconductor substrates include silicon substrates and silicon on insulator (SOI) substrates. The surface region of the silicon substrate has been heavily doped (i.e., a dopant concentration in excess of $1 \times 10^{19}$ atoms/$cm^3$ of dopant). The first layer of insulating material has a thickness in the range of about 25 nm to about 250 nm. The thickness of the first layer is selected so that the gate-source capacitance ($C_{gs}$) between the gate and the source or drain (depending upon which of the source or the drain is formed in the substrate) is sufficiently low. This consideration favors a thickness within the higher portion of the above-described range. The thickness of the first layer is also selected so that the series resistance of the source/drain extension is sufficiently low and that outdiffison from the heavily doped region of the substrate to form the source/drain extension is readily accomplished. These considerations favor a thickness within the lower portion of the above-described range. One skilled in the art will be able to select a suitable thickness based upon the above-described considerations, as well as other considerations that apply to specific embodiments.

A second layer of material is formed over the first layer of material. However, the material of the second layer (e.g., silicon dioxide ($SiO_2$)) has a significantly different etch resistance to a selected etchant than the insulating material of the first layer. Specifically, for the selected etchant, the etch rate of the material of the second layer is much higher than the etch rate of the insulating material of the first layer. It is advantageous if the etch rate of the second layer of material in the selected etchant is at least about ten times faster than the etch rate of the first layer of material. For the selected etchant, the etch rate of the material of the second layer is also at least ten times faster than the etch rate of a semiconductor material in which the channel of the device is formed. Crystalline silicon is one example of such a semiconductor material. It is advantageous if the etch rate of the material of the second layer is at least 100 times faster than the etch rate of the semiconductor material.

The thickness of the second layer of material is selected to define the physical gate length of the device. This is because this second layer is sacrificial, i.e., it will be removed and the gate of the device will be formed in the space defined by this layer. Defining the gate length in this manner provides much better gate length control than is achievable using conventional lithographic techniques.

A third layer of material is formed over the second layer. The material selected for the third layer is an electrically insulating material. It is advantageous if the insulating material in the third layer has a lower etch rate in the selected etchant than the material of the second layer. It is advantageous if the ratio of the etch rate, in the selected etchant, of the material in the second layer to the etch rate of the material in the third material layer is at least ten to one. From the standpoint of ease of processing, it is advantageous if the material of the first layer is the same as the material of the third layer.

A window or trench (referred to simply as a window hereinafter) is then etched through the three-layer structure to the heavily-doped surface of the silicon substrate. The dimensions of the window are determined by the size constraints for the particular device and the limitations of the lithographic techniques used to form the window. The window is formed using conventional lithographic techniques. Specifically, a mask is formed over the three layer structure by forming a layer of an energy-definable material thereon and introducing an image of a pattern into the layer of energy-definable material therein. The pattern is then developed and the only portion of the three layer structure exposed through the mask is the portion that corresponds to the dimensions and placement of the desired window or trench. The window is then etched into the three-layer structure. After the window is etched, the portions of the mask remaining on the substrate surface are removed using conventional expedients well known to one skilled in the art.

The window is then filled with a semiconductor material. Although the semiconductor material is either crystalline, polycrystalline, or amorphous, typically the semiconductor material is a crystalline material such as silicon, silicon-germanium, or silicon-germanium-carbon. The crystalline semiconductor material need not be uniform in composition. The crystalline semiconductor material is either doped or undoped. Techniques for forming crystalline semiconductor materials in windows are well known to one skilled in the art. For example, in one technique, the crystalline material is formed in the window or trench epitaxially. In another embodiment, an amorphous layer of the semiconductor material is deposited on the substrate and all but the semiconductor material deposited in the window, and a small plug at the top of the window, is removed. The amorphous semiconductor material is then annealed to recrystallize the material (solid phase epitaxy).

The channel of the device and the source and drain extensions of the device are formed in the semiconductor (e.g. silicon) plug formed in the window. Therefore, the silicon plug is doped in certain regions. A variety of ways to dope the silicon plug are contemplated as suitable. In one embodiment, a doped silicon plug is formed either in-situ during growth, by implantation after the plug is formed, or by another suitable expedient. Dopants of the opposite type can be driven into the plug from one or more of the adjacent multiple layers of material (i.e. the multiple layers of material in which the crystalline semiconductor-filled window is formed) to form the source and drain extensions. This technique is known as solid phase diffusion. In solid phase diffusion a doped oxide (e.g. silicon dioxide) is used as a dopant source. The silicon dioxide is doped with the desired dopant (e.g. arsenic, phosphorus, boron). At elevated temperatures, the dopant is driven from the doped oxide into the adjacent crystalline semiconductor material. This technique is advantageous because the doped area is defined by the interface between the plug and the layer of material used as the dopant source. This technique allows for the formation of self-aligned source/drain extensions (i.e. source and drain extension regions that are aligned to the gate).

One skilled in the art is familiar with the manner in which dopants are introduced in situ as a layer of material is formed via chemical vapor deposition, and such techniques are not described in detail herein. Generally, the dopants are introduced into the atmosphere at the appropriate point in the deposition of the material so that the dopants are present in the desired place in the silicon plug and at the desired concentration. In other embodiments, dopants are implanted in the channel after the channel is formed or diffused out from the heavily doped substrate into the bottom of the plug.

After the doped silicon (or other semiconductor) plug is formed, a fourth layer of material is formed over the substrate. The layer of material has an etch resistance in the selected etch expedient that matches the etch resistance of the first and third material layers. It is advantageous, based on process considerations, for this layer of material to be the same as the third material layer.

Another etch mask is formed over the substrate using conventional lithographic techniques. This etch mask is patterned so that the portion of the fourth material layer overlying the silicon plug and the portion of the fourth material layer adjacent to the plug are not exposed through the mask. The resulting masked structure is then anisotropically etched to the second material layer. As a result of the etch, the portion of the second layer underlying the unmasked part of the structure is exposed. The resulting structure is then isotropically etched. As a result of the etch and the difference in etch rate between the second material layer and the first and third material layers, the second material layer is completely removed but the first material layer and the portion of the third/fourth material layers over and adjacent to the top of the silicon plug remain. As a result of this etch, the portion of the silicon plug that corresponds to the thickness of the second layer is exposed. The exposed portion of the silicon plug defines the gate length of the device being formed.

The substrate is then subjected to conditions that grow a layer of thermal oxide on the exposed portion of the silicon plug. The layer of thermal oxide is then removed using conventional expedients such as a wet etch (e.g., aqueous hydrofluoric acid) or anhydrous hydrofluoric acid. This sacrificial oxidation is done to repair sidewall defects. After the layer of thermal oxide is removed, a layer of gate dielectric (e.g. silicon dioxide or other suitable high dielectric constant materials) is formed on the exposed portion of the silicon plug. Examples of other suitable gate dielectric materials include silicon dioxide, silicon nitride, silicon oxynitride and metal oxides (e.g. tantalum pentoxide, titanium oxide, and aluminum oxide). The thickness of the gate dielectric ranges from about 1 nm to about 20 nm. The selected thickness will depend upon the dielectric constant of the dielectric material.

In one embodiment, a gate dielectric layer of silicon dioxide is formed by heating the substrate to a temperature in the range of about 700° C. to about 1100° C. in an oxygen-containing atmosphere. Both furnace oxidation and rapid thermal oxidation are contemplated as suitable. Other expedients, such as chemical vapor deposition, jet vapor deposition, or atomic layer deposition are also contemplated as suitable for forming the gate dielectric. Conditions for forming a gate dielectric of the desired thickness are well known to one skilled in the art.

A gate electrode is then formed by depositing a sufficiently conformal layer of a suitable gate material (e.g. in situ doped amorphous silicon) on the substrate. The layer is patterned and subsequently recrystallized to form the gate. The gate configuration is largely a matter of design choice. However, the gate does surround the portion of the silicon plug with the gate oxide formed thereon.

DETAILED DESCRIPTION

The present invention is directed to a process for fabricating a vertical transistor. In the process, multiple layers of material are formed on the surface of a silicon substrate in which either a source region or a drain region for the device is formed. The multiple layers have different etch resistances in a selected etch expedient. One of the layers in the multiple layer structure is a sacrificial layer used to define the physical gate length of the device. Specifically, the thickness and placement of the sacrificial layer defines the thickness and placement of the gate of the vertical transistor.

Figure 1:
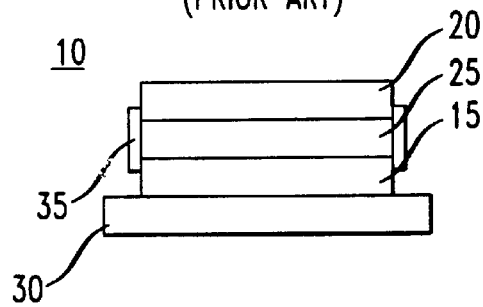
FIG. 1 is a schematic side view of a vertical transistor.
Figure 2A:
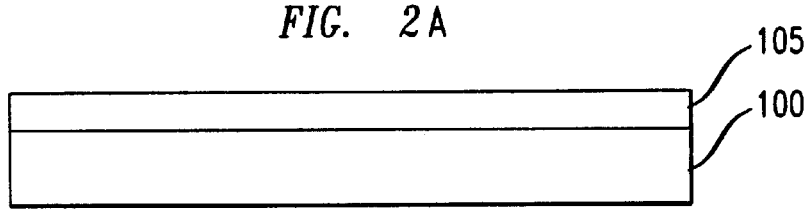
FIG. 2A–2J illustrates the process sequence of one embodiment of the present invention.

One embodiment of the present invention is described with reference to FIG. 2A–2J. Referring to FIG. 2A, a heavily doped source region 105 is formed in silicon substrate 100. In this embodiment, the source region of the device is formed in the silicon substrate and the drain region is formed on top of the subsequently formed vertical channel. In an alternate embodiment, the drain region is formed in the substrate and the source region is formed on top of the subsequently formed vertical channel. The embodiment wherein the source region is formed in the substrate is the subject of this description. From this description, one skilled in the art could easily form a device in which the drain region is formed in the silicon substrate and the source region is formed on top of the subsequently formed vertical channel.

The depth of the heavily doped source region, the concentration of dopant therein and the type of dopant (i.e. n-type or p-type) are all a matter of design choice. A heavily doped source region 105 wherein the dopant is phosphorus (P), arsenic (As), antimony (Sb) or boron (B), the dopant concentration is in the range of about $1\times10^{19}$ atoms/cm$^3$ to about $5\times10^{20}$ atoms/cm$^3$, and the depth of the region in the substrate is less than about 200 nm, is contemplated as suitable.

Figure 2B:
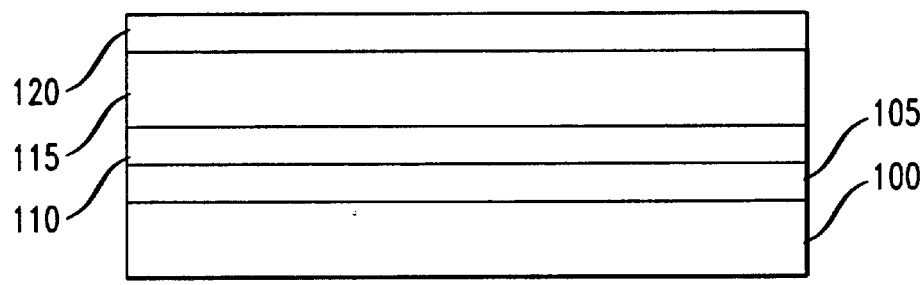

Referring to FIG. 2B, three layers of material 110, 115, and 120, are formed over the heavily doped source region 105 in the silicon substrate 100. The first layer of material 110 is an electrically insulating material such as $Si_3N_4$. Material layer 110 electrically isolates the deep source region 105 from the overlying gate electrode (155 in FIG. 2J). Thus, material layer 110 is made of a material and has a thickness that is consistent with this objective. A thickness in the range of about 25 nm to about 250 nm is contemplated as suitable for material layer 110.

A second layer of material 115 is formed over the first layer of material 110. However, the material of the second layer 115 has a significantly different etch resistance to a selected etchant than the insulating material of the first layer 110. Specifically, for the selected etchant, the etch rate of the material of the second layer 115 is much higher than the etch rate of the insulating material of the first layer 110. It is advantageous if, for the selected etchant, the etch rate of the material of the second layer 115 is much higher than the etch rate of a semiconductor material in which the device channel is formed (i.e. the plug material (130 in FIG. 2D)). Crystalline silicon is an example of a suitable semiconductor plug material.

The thickness of the second layer 115 of material is selected to define the physical gate length of the device. This is because this second layer 115 is sacrificial, i.e., it will be removed and the gate of the device will be formed in the space defined by this layer. When the sacrificial second layer 115 is removed, the gate oxide (150 in FIG. 2H) is formed on what is to become the channel of the device.

A third layer of material 120 is formed over the second layer 115. The material selected for the third layer 120 is an electrically insulating material. It is advantageous if the insulating material in the third layer 120 has a lower etch rate in the selected etchant than the material of the second layer 115. It is advantageous if the ratio of the etch rate, in the selected etchant, of the material in the second layer 115 to the etch rate of the material in the third material layer 120 is at least about ten to one.

Figure 2C:
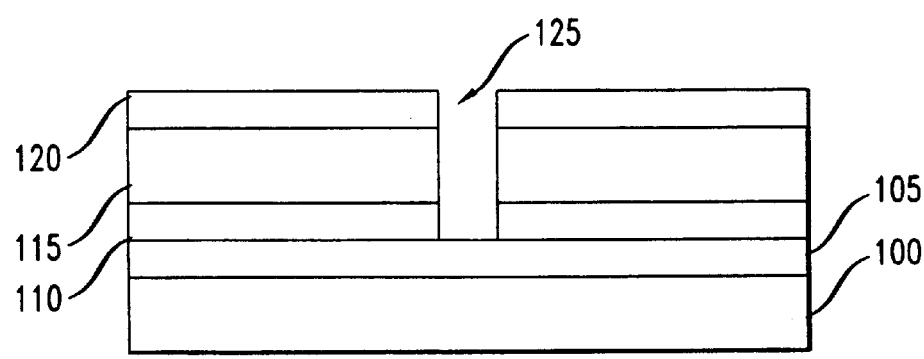

Referring to FIG. 2C, an opening such as a window or trench 125 (for convenience, window or trench will simply be referred to as a window hereinafter) is then etched through the three layers 110, 115, and 120 to the heavily-doped surface 105 of the silicon substrate 100. The cross-sectional thickness (horizontal dimension in cross-section) of the window is determined by the size constraints for the particular device and the limitations of the lithographic techniques used to form the window. The length of the trench (the length being orthogonal to both the horizontal dimension in cross-section as well as the vertical direction) is largely a matter of design choice. For a given horizontal dimension in cross-section, the current passed through the conductor formed in the opening will increase with increasing trench length. The window is formed using conventional lithographic techniques.

Figure 2D:
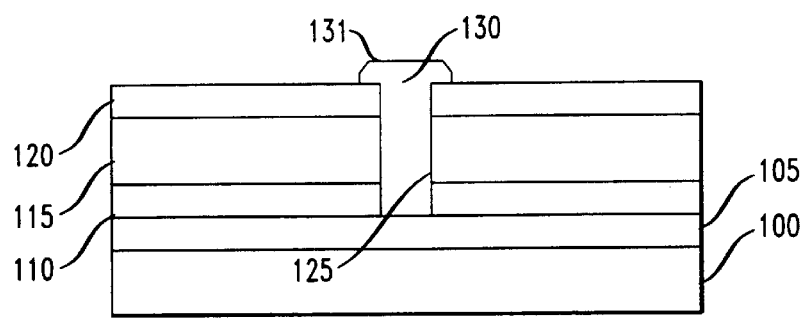

Referring to FIG. 2D, the window 125 is then filled with a single crystalline semiconductor material such as silicon 130. Other examples of crystalline semiconductor materials include silicon-germanium and silicon-germanium-carbon. The crystalline semiconductor material is either doped or undoped. Techniques for forming crystalline semiconductor materials in windows are well known to one skilled in the art. For example, the crystalline material is formed in the window 125 epitaxially. In another embodiment, an amorphous layer of the semiconductor material is deposited on the surface of the substrate and all but the semiconductor material 130 deposited in the window 125, and a small plug 131 at the top of the window 125, is removed. The amorphous semiconductor material is then annealed to recrystallize the material.

The semiconductor (e.g. silicon) plug formed in the window 125 becomes the channel of the device. Therefore, the silicon plug 130 is doped to form the channel (not shown), as well as source and drain extensions (also not shown). Dopants of one type (i.e. n-type or p-type) are introduced into the silicon plug 130 to form the source and drain extensions and dopants of the opposite type are introduced into the plug to form the channel. A variety of ways to dope the silicon plug are contemplated as suitable. In-situ doping of the silicon plug as it is formed or implantation of dopants into the silicon plug after it is formed are contemplated as suitable expedients.

Dopants can be driven into the single crystalline silicon plug 130 by using layers 110 and 120 as sources of the dopant for the source and drain extensions. This technique is known as solid phase diffusion in which an oxide (e.g. silicon dioxide) is used as a dopant source. The silicon dioxide is doped with the desired dopant (e.g. arsenic, phosphorus, boron). At elevated temperatures, the dopant is driven from the doped oxide to the adjacent undoped (or lightly doped with the opposite type dopant) crystalline semiconductor material. This technique is advantageous because the doped area is defined by the interface between the silicon plug 130 and the layer(s) of material, 110 and 120, used as the dopant source. This technique allows for the formation of self-aligned source/drain extensions (i.e. the source/drain extensions are aligned with the gate). Examples of solid phase diffusion techniques are described in Ono, M., et al., "Sub-50 nm Gate Length N-MOSFETS with 10 nm Phosphorus Source and Drain Junctions," *IEDM*93, pp. 119–122 (1993) and Saito, M., et al., "An SPDD D-MOSFET Structure Suitable for 0.1 and Sub 0.1 Micron Channel Length and Its Electrical Characteristics," *IEDM*92, pp. 897–900 (1992), which are hereby incorporated by reference.

One skilled in the art is familiar with the manner in which dopants are introduced in situ as a layer of material is formed via chemical vapor deposition and such techniques are not described in detail herein. Generally, the dopants are introduced into the atmosphere at the appropriate point in the deposition of the material so that the dopants are present in the desired place in the silicon plug and at the desired concentration. In other embodiments, dopants are implanted in the channel after the channel is formed and diffused out from the heavily doped substrate into the bottom of the plug to form a source/drain extension region. Ion implantation is a suitable expedient for forming the source/drain extension regions at the top of the plug.

Figure 2E:
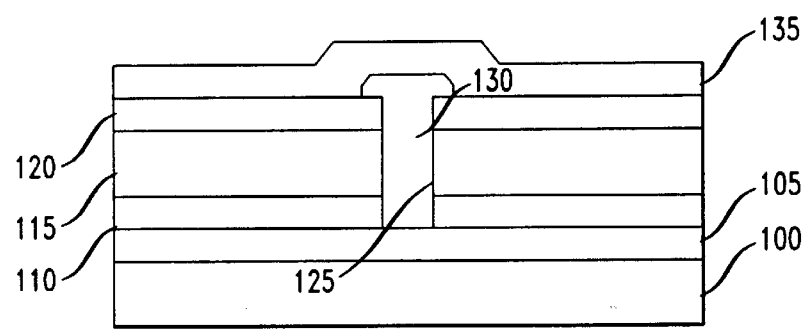

After the window 125 is filled with single crystal silicon 130, and the silicon 130 is doped in the desired manner, a fourth layer of insulating material 135 is formed over the substrate as illustrated in FIG. 2E. The layer 135 is a material that has an etch resistance in the selected etch expedient that matches the etch resistance of layers 110 and 120. It is advantageous, based on process considerations, for layer 135 to be of the same material as layer 120 underneath it. Once the silicon plug 130 is doped and the dopant is distributed in the plug 130 in the desired manner, the substrate is not subjected to conditions that significantly affect the distribution of the dopant in the silicon plug 130. Consequently, after this step, the substrate is not exposed to temperatures that exceed 1100° C. It is advantageous if the substrate is not exposed to temperatures in excess of 100° C. after this point in the process. In certain embodiments, the substrate is not exposed to temperatures that exceed 900° C. after this point in the process for prolonged periods of time (e.g. in excess of several minutes). However, the substrate can be subjected to a rapid thermal anneal at temperatures of up to about 100° C. without adversely affecting the distribution of the dopant in the silicon plug 130.

Figure 2F:
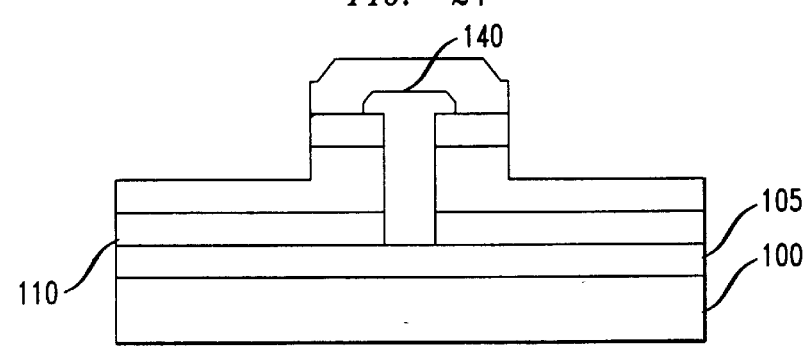

Another etch mask (not shown) is formed over the multilayer structure using conventional lithographic techniques. This etch mask is patterned so that the portion of the fourth material layer overlying the silicon filled window and the portion of the fourth material layer adjacent to the windows are not exposed through the mask. The structure with the etch mask formed thereon is then etched anisotropically using a conventional dry etch expedient. In the dry etch expedient, the etch rates of layers 110, 115, 120, and 135 are about the same, or layer 115 has a lower etch rate than that of layers 110, 120, and 135. The structure obtained as a result of this etch is illustrated in FIG. 2F. As a result of this etch,.i portion of layers 135 and 120 that are exposed throughout the mask are completely removed. Also, the portion of layer 115 that is not covered by the mask is etched part way through its thickness.

Figure 2G:
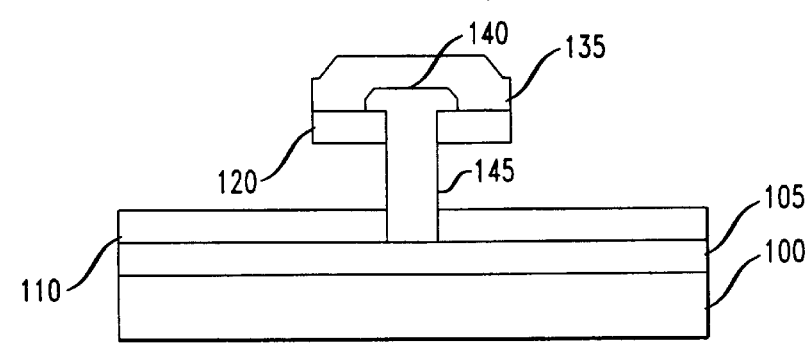
Figure 2H:
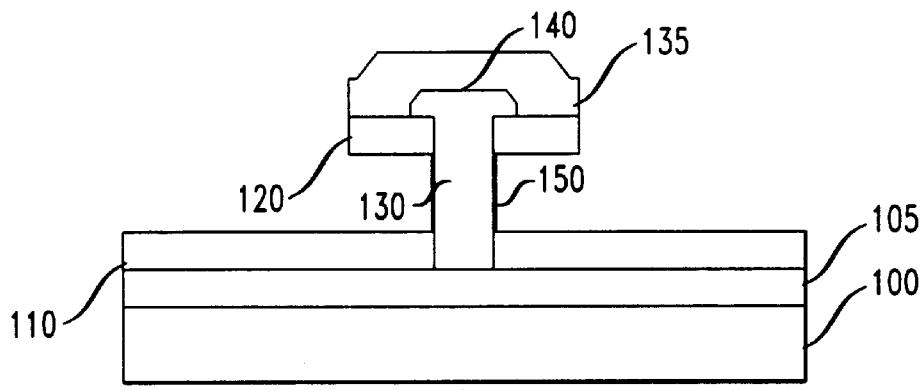

The substrate is then subjected to a wet etch or isotropic dry etch expedient. The etch rate of layer 115 in this expedient is significantly faster than the etch rate of layers 110, 120, and 135. As illustrated in FIG. 2G, due to the etch selectivity in the wet etch expedient, the sacrificial layer between layers 110 and 120 is completely removed without removing a significant portion of layer 110 and the remaining portions of layers 120 and 135. The portion of layers 120 and 135 over and adjacent to the top 140 of the silicon plug 130 remain. As a result of this etch the portion of the silicon plug 130 that corresponds to the thickness of layer 115 is exposed. The exposed surface 145 of the plug 130 will be the physical gate length of the device being formed.

The substrate is then heated in an oxygen-containing atmosphere to grow a layer of thermal oxide (not shown) on the exposed surface of the crystal silicon plug 130. The thin layer of thermal oxide is removed using conventional expedients such a wet etch (e.g., aqueous hydrofluoric acid). As a result of the formation and removal of the sacrificial thermal oxide, the surface of the silicon plug 130 is smoother and some of the sidewall defects are removed. The particular conditions used to form and remove the sacrificial oxide are optionally selected to tailor the width of the silicon plug to a desired dimension.

After the thin layer of thermal oxide is removed, a layer of gate dielectric (e.g. silicon dioxide, silicon oxynitride, silicon nitride or metal oxide) 150 (FIG. 2H) is formed on the exposed portion of the silicon plug 130. The thickness of the gate dielectric is about 1 nm to about 20 nm. In one embodiment, the silicon dioxide layer is formed by heating the substrate to a temperature in the range of about 700° C. to about 1100° C. in an oxygen-containing atmosphere. Other expedients for forming the gate dielectric, such as chemical vapor deposition, jet vapor deposition, and atomic layer deposition, are also contemplated as suitable. Conditions for forming a gate dielectric of the desired thickness are well known to one skilled in the art.

Figure 2I:
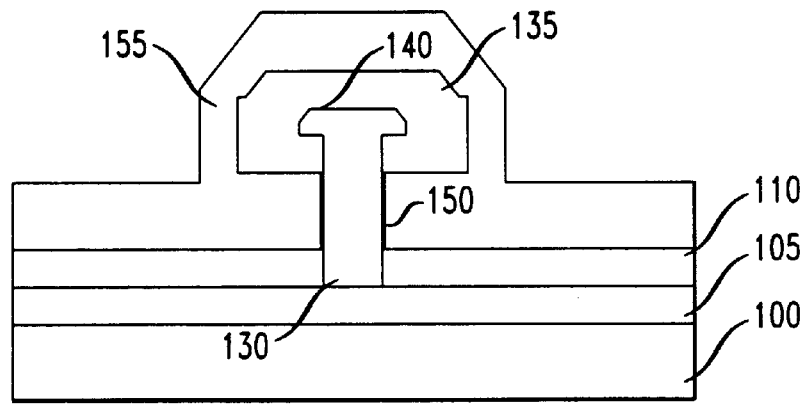

Referring to FIG. 2I, a gate electrode is then formed by depositing a conformal layer 155 of suitable gate material (e.g. in situ doped amorphous silicon). The amorphous silicon is then subsequently recrystallized using conditions that do not significantly affect the dopant profiles of the dopants in the silicon plug. Other examples of suitable gate materials include polycrystalline silicon, silicon-germanium, and silicon-germanium-carbon. Metals and metal-containing compounds that have a suitably low resistivity and are compatible with the gate dielectric material and semiconductor processing are also contemplated as suitable gate materials. It is advantageous for the gate material to have a work function that is sufficiently near the middle of the band gap of the semiconductor plug material. Examples of such metals include titanium, titanium nitride, tungsten, tungsten silicide, tantalum, tantalum nitride, and molybdenum. Suitable expedients for forming the layer of gate material include chemical vapor deposition, electroplating, and combinations thereof.

Figure 2J:
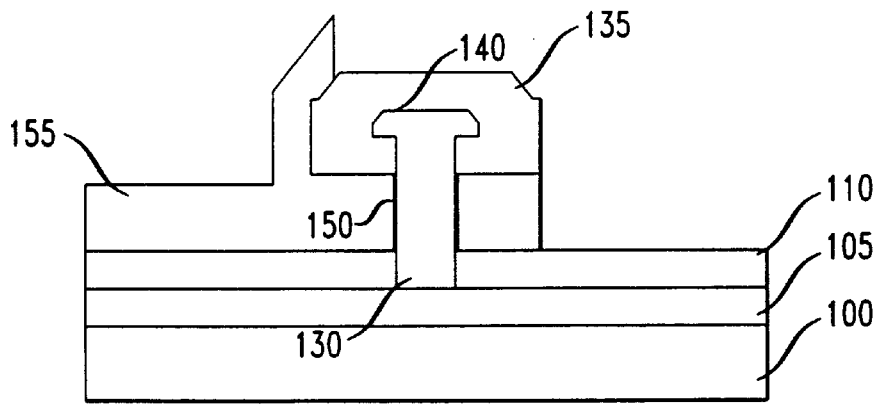

Referring to FIG. 2J, the layer 155 is patterned to form the gate 155. The gate configuration is largely a matter of design choice. However, the gate does surround the portion of the silicon plug with the gate oxide formed thereon.

Figure 3A:
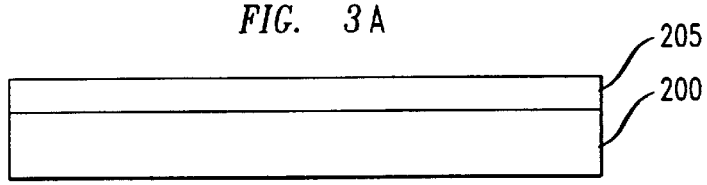
FIG. 3A–3P illustrates the process sequence of a second embodiment of the present invention.

Another embodiment of the present invention is described with reference to FIGS. 3A–3P. Referring to FIG. 3A, a heavily-doped source region 205 is formed in silicon substrate 200. One example of a suitable substrate 200 is a silicon substrate doped with boron. The concentration of boron dopant is about $2 \times 10^{15}$ atoms/cm$^3$. The depth of the deep source region, the concentration of dopant therein and the type of dopant (i.e. n-type or p-type) are all a matter of design choice. An n$^+$deep source region 205 wherein the dopant is antimony or arsenic, the peak dopant concentration is greater than $1 \times 10^{19}$ atoms/cm$^3$, and the depth of the doped region in the substrate is less than about 200 nm, is contemplated as suitable.

Figure 3B:
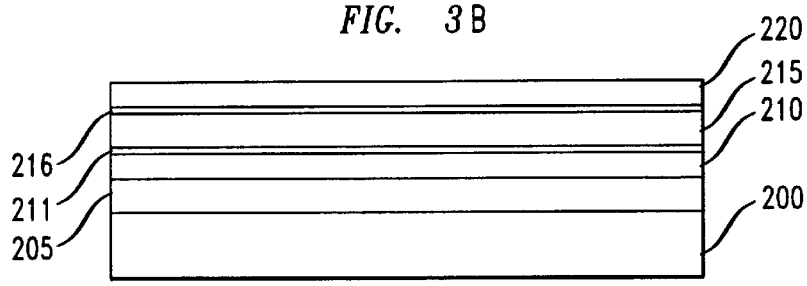

Referring to FIG. 3B, five layers of material 210, 211, 215, 216 and 220, are formed over the deep source region 205 in the silicon substrate 200. The first layer of material 210 is an electrically insulating material. Material layer 210 electrically isolates the deep source region 205 from what will eventually be the overlying gate electrode (265 in FIG. 3P). Thus, material layer 210 is made of a material and has a thickness that is consistent with this objective. Examples of suitable materials include doped silicon oxides. In certain embodiments, the first layer is also used as a source for dopants. The dopant source is used for doping the subsequently formed vertical channel (FIG. 3C) of the device. One example of a silicon oxide doping source is PSG (phosphosilicate glass, i.e., a phosphorus-doped silicon oxide). One skilled in the art is aware of the suitable expedients for forming a layer of PSG on a substrate (e.g. plasma-enhanced chemical vapor deposition (CVD)). Suitable thicknesses are in the range of about 25 nm to about 250 nm.

A second layer of material 211 is formed over the first layer of material 210. The second layer is intended as an etch stop. An etch stop, as one skilled in the art is aware, is designed to prevent an etch from proceeding to an underlying layer or layers. One skilled in the art is aware that the selection of an etch stop layer is determined by the particular etch expedients used to etch the overlying layers. In the process of the present invention wherein the overlying layers are PSG and undoped silicon oxide (e.g. silicon oxide formed from tetraethylene ortho silicate (TEOS)), an etch stop material that effectively stops etchants for such materials from penetrating to underlying layers is selected. Silicon nitride, $Si_3N_4$, is contemplated as a suitable etch stop material. The thickness of an etch stop layer is largely dependent upon the resistance of the etch stop material to the selected etchant (i.e. to be an effective etch stop, the etchant cannot penetrate the etch stop layer in the time needed to conduct the etch).

A third layer of material 215 is formed over the second layer of material 211. However, the insulating material of the third layer 215 has a significantly different etch resistance to a selected etchant than the insulating material of the etch stop layer 211. Specifically, for the selected etchant, the etch rate of the insulating material of the third layer 215 is much higher than the etch rate of the insulating material of the etch stop layer 211.

The thickness of the third layer of material 215 is selected to correspond to the gate length of the device. When the sacrificial third layer 215 is removed, the gate oxide (250 in FIG. 3M) is formed on what is to become the channel 260 (FIG. 3P) of the device.

A fourth layer of material 216 is formed over the third layer 215. This fourth layer of material 216 has the same function as layer 211. Therefore the considerations that govern the selection of a material and thickness of layer 211, govern the selection of a material and thickness for layer 216.

A fifth layer of insulating material 220 is formed over the fourth layer 216. It is advantageous if the insulating material in the fifth layer 220 has the same etch rate in the selected etchant as the insulating material of the first layer 210. From the standpoint of ease of processing, it is advantageous if the material of the first layer 210 is the same as the material of the fifth layer 220.

Figure 3C:
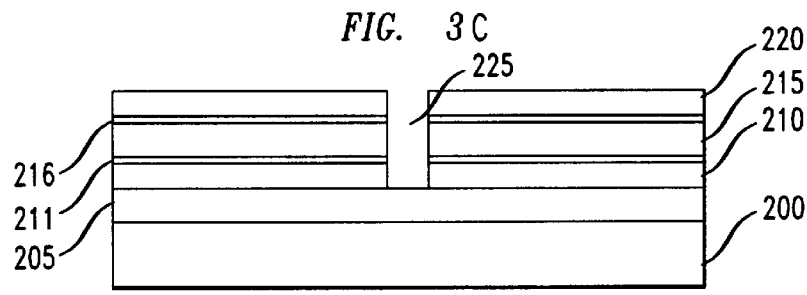
Figure 3D:
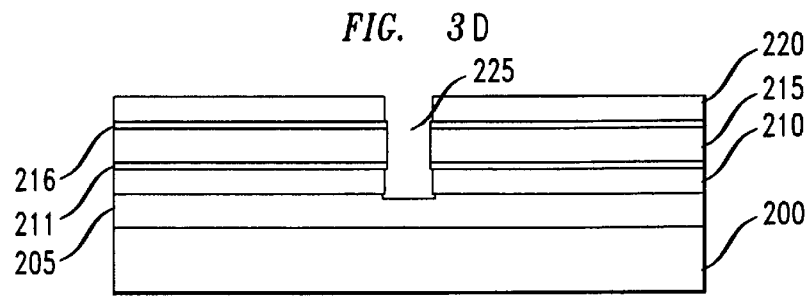

Referring to FIG. 3C, a window 225 is then etched through the five layers 210, 211, 215, 216 and 220 to the heavily-doped region 205 of the silicon substrate 200. The diameter of the window is determined by the size constraints for the particular device and the limitations of the lithographic techniques used to form the window. The window is formed using conventional lithographic techniques. The window 225 is then subjected to a chemical clean (e.g. RCA or piranha-clean) to clean the silicon at the bottom of the window. As a result of this cleaning step, a small portion of the layers 210 and 220 adjacent to window 225 are removed. The results of this etch are illustrated in FIG. 3D.

Figure 3E:
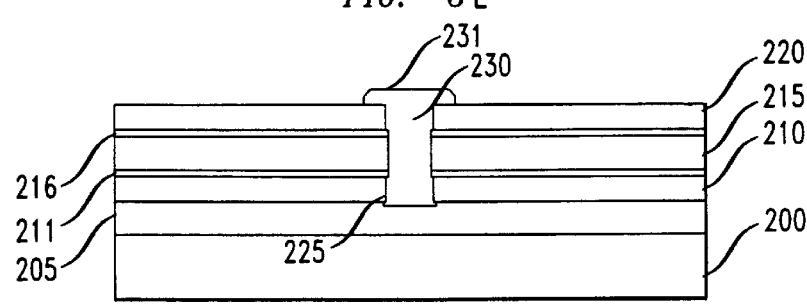

Referring to FIG. 3E, the window 225 is then filled with a crystalline semiconductor material (e.g. silicon) 230. Techniques for forming single crystalline silicon in windows are well known to one skilled in the art. In one embodiment, epitaxial silicon is deposited selectively in the window 225. In another embodiment, amorphous silicon is deposited over the entire substrate surface and all but the silicon 230 deposited in the window 225, and a small portion 231 at the top of the window, is removed. The amorphous semiconductor material is then recrystallized by annealing the substrate.

Figure 3F:
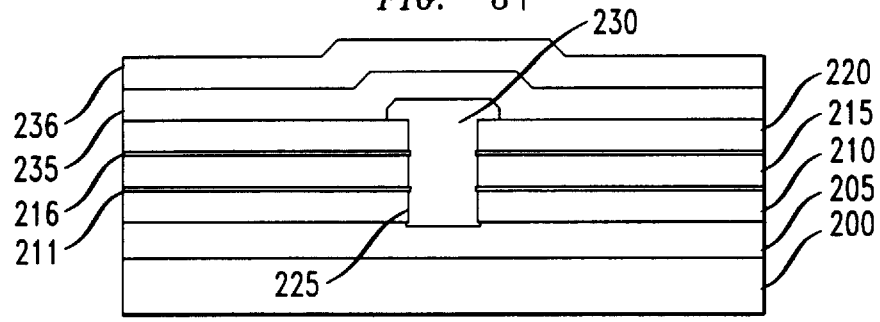
Figure 3G:
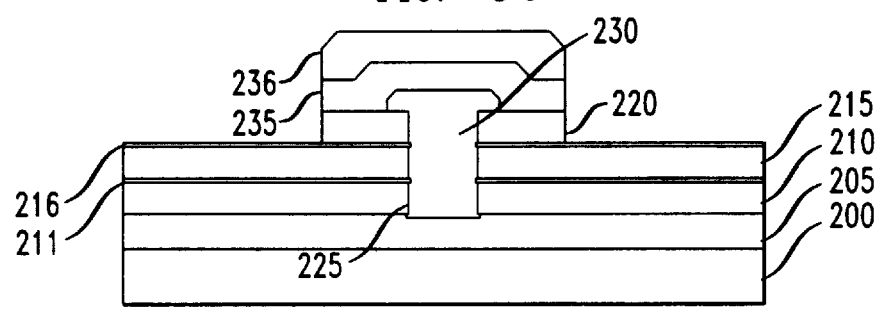
Figure 3H:
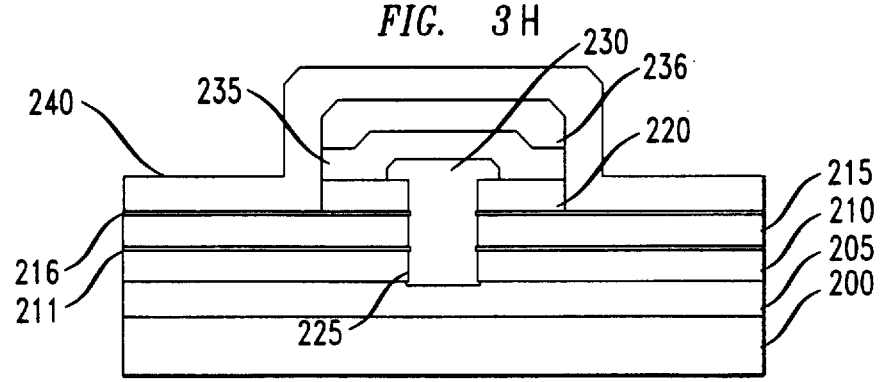
Figure 3I:
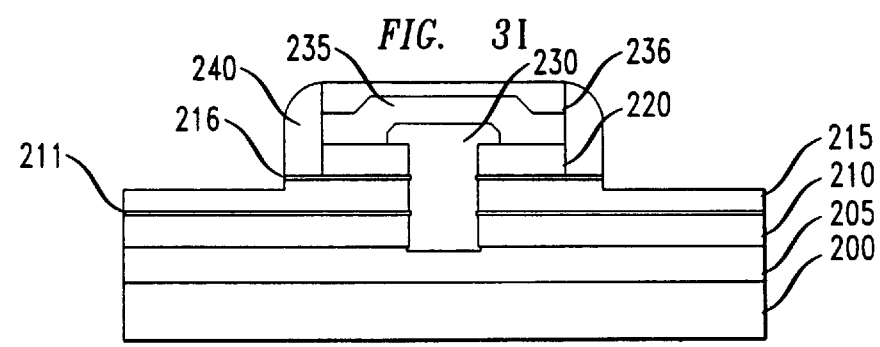
Figure 3N:
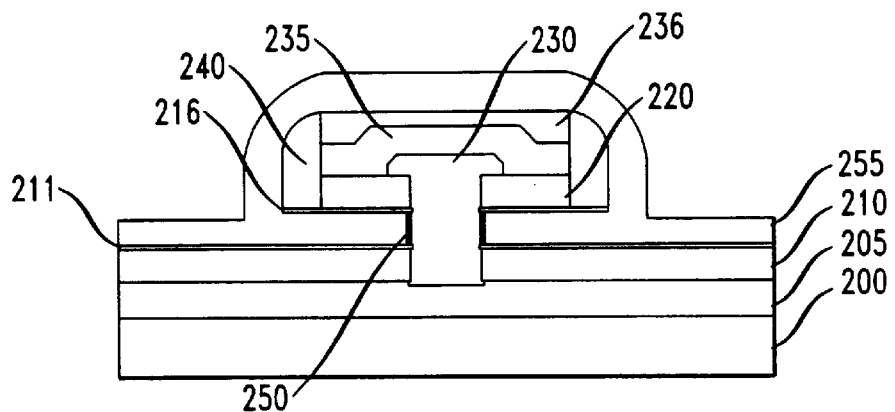
Figure 3O:
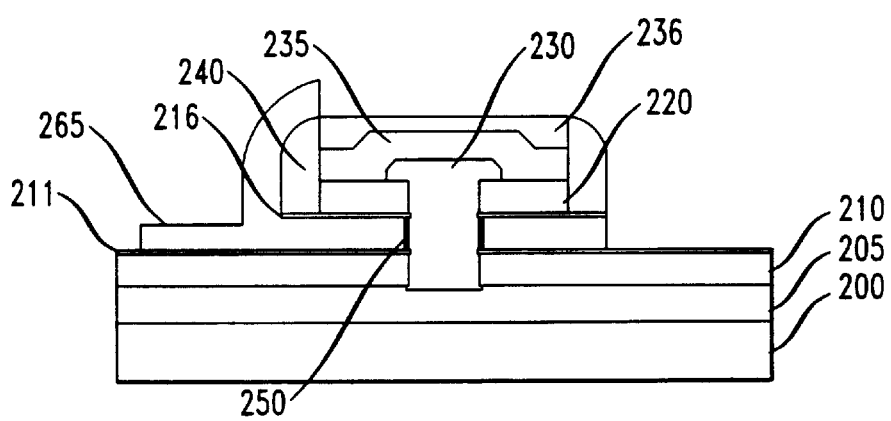
Figure 3P:
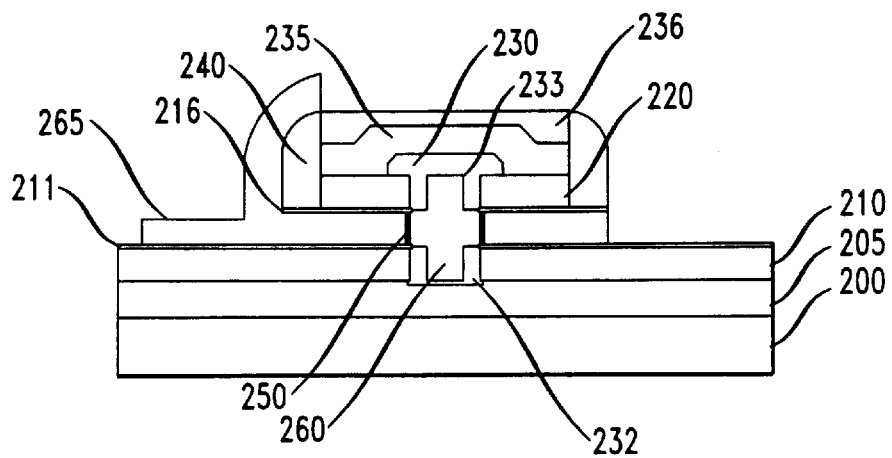

The crystalline semiconductor plug 230 formed in the window 225 becomes the channel of the device (260 in FIG. 3P). Therefore, the crystalline semiconductor plug 230 is doped. It is advantageous if the dopant for channel region 260 is introduced in situ as the plug 230 is being formed. However, implantation of the dopant is also contemplated as suitable.

After the window 225 is filled with crystalline semiconductor 230, and the semiconductor 230 is doped in the desired manner, a sixth layer of material 235 is formed over the substrate as illustrated in FIG. 3F. The layer 235 is a material that provides for a self-aligned top contact (drain contact 235 in FIG. 3G). One example of a suitable material is doped polycrystalline silicon. The selected dopant is a type of dopant that is opposite the type used to dope the silicon channel (260 in FIG. 3P). The concentration of the dopant is greater than about $10^{20}$ atoms/cm$^3$.

As illustrated in FIG. 3F, a layer of material 236 is deposited over layer 235. This material is patterned so that the remaining portion overlies the crystalline semiconductor plug 230, and the region adjacent thereto (FIG. 3G). The material for layer 236 is selected to have an etch rate that is significantly lower than the etch rate of the material of layer 215 in the etchant selected to remove layer 215. In this regard it is advantageous if the material selected from layer 236 is the same as the material of layers 211 and 216. One example of a suitable material is silicon nitride. The layer of silicon nitride 236 is formed over the layer 235 using the previously described techniques.

As illustrated in FIG. 3G, using conventional lithographic techniques, layers 236, 235 and 220 are patterned (using one or more dry etch steps) so that only those portions of the layers either overlying the silicon filled window, and/or adjacent to the silicon filled window, remain. The remaining portions of layers 220, 235, and 236 form the drain of the device. As illustrated in FIG. 3H, a layer of material 240 then deposited. The material for layer 240 is selected to have an etch rate that is significantly lower than the etch rate of the material of layer 215 in the etchant selected to remove layer 215. One example of a suitable material for layer 240 is silicon nitride. The thickness of layer 240 is selected so that the remaining portions of layers 235 and 220 are protected from contact with subsequent etchants. Layer 240 is then etched using an anisotropic etchant such as a dry plasma etch. As illustrated in FIG. 3I, the only portion of layer 240 that remains after the anisotropic etch is the portion adjacent to layers 220 and 235. As a result of this etch, layer 215 is exposed.

The substrate is then subjected to a wet etch (e.g. aqueous hydrofluoric acid) or an isotropic dry etch (e.g. anhydrous hydrofluoric acid), which removes the exposed, remaining portion of layer 215. As illustrated in FIG. 3J, the remaining portion of layer 210 is still covered by layer 211 and layers 220 and 235 are encapsulated by the remaining portions of layers 216, 236, and 240. Consequently, the remaining portions of layers 210, 220 and 235 remain isolated from contact with subsequent etch expedients.

Referring to FIG. 3K, a layer of sacrificial thermal silicon dioxide 245 is grown on the exposed surface of silicon plug 230. Sacrificial silicon oxide thicknesses on the order of less than about 10 nm are contemplated as suitable. The sacrificial silicon oxide 245 is then removed (FIG. 3L) using a conventional isotropic etch (e.g. aqueous hydrofluoric acid). As a result of the formation and removal of the sacrificial oxide, the surface of the silicon plug 230 is smoother and some of the sidewall defects are removed. Layer 211 prevents the wet etch expedient from contacting layer 210. As a result of this etch the portion of the silicon plug 230 that corresponds to the deposited thickness of layer 215 is exposed. The exposed portion of the plug 230 defines the physical gate length of the device being formed.

The substrate is then subjected to conditions which form a layer of gate dielectric 250 on the exposed portion of the silicon plug 230. The resulting structure is illustrated in FIG. 3M. The thickness of the gate dielectric 250 is about 1 nm to about 20 nm. One example of a suitable thickness is 6 nm. In For example, if the semiconductor plug is silicon, a gate dielectric layer of silicon dioxide is formed by heating the substrate to temperature in the range of about 700° C. to about 1100° C. in an oxygen-containing atmosphere. Other expedients for forming gate dielectrics (e.g. chemical vapor deposition, jet vapor deposition, or atomic layer deposition) are also contemplated as suitable. Conditions for forming a gate dielectric of the desired thickness are well known to one skilled in the art.

Referring to FIG. 3N, a gate electrode is then formed by depositing a layer 255 of sufficiently conformal and suitable gate material (e.g. a layer of doped amorphous silicon in which the dopant is introduced in situ). The amorphous silicon is then subsequently recrystallized to form polycrystalline silicon. The dopant concentration is sufficient so that the resistivity of layer 255 is sufficiently low. Referring to FIG. 3O, the layer 255 is patterned to form the gate of the device 265. The gate configuration is largely a matter of design choice. However, the gate does surround the portion of the silicon plug 230 with the gate oxide 250 formed thereon.

Referring to FIG. 3P, dopants are then driven into the crystalline semiconductor plug 230 by solid phase diffusion from dopant source layers 210 and 220 to form source 232 and drain 233 extensions. The advantage of this technique is that the source and drain extensions (and, consequently, the channel of the device) are aligned with what will become the gate of the device. The concentration of the dopant in the portion of the crystalline semiconductor plug 230 that is doped by solid phase diffusion for source layers 210 and 220 is typically at least about $1\times10^{19}/cm^3$, with dopant concentrations of about $5\times10^{19}/cm^3$ contemplated as advantageous. With this solid phase diffusion technique, very shallow source and drain extensions are obtainable. The distance that the source 232 and drain 233 extensions penetrate into the plug 230 is preferably less than one half of the width of the plug. Limiting dopant penetration in this manner avoids significant overlap in doped regions from opposite sides of the plug 230. Also, the distance that the source 232 and drain 233 extensions extend under the device gate is preferably limited to less than one-fourth of the gate length. The dopants are of the opposite type of the dopant that is in the channel region 260 of the plug 230.

In an alternate embodiment (not shown), the top portion 231 of the silicon plug 230 (FIG. 3E) is polished back so that the top of silicon plug 230 is co-planar with the top of layer 220. An expedient such as chemical mechanical polishing is contemplated as suitable. Polishing back the top portion of the silicon plug 230 in this manner allows for better control of the diffusion of dopants from layer 235 into the silicon plug 230 to form the top source/drain contact.

In yet another alternate embodiment, a thin layer (e.g. a thickness of about 25 nm) of undoped silicon dioxide is formed over layer 205. Referring to FIG. 3E, this layer (not shown) acts as a barrier to solid phase phosphorous dopant diffusion from the heavily- doped dopant-source layer 210, down through layer 205, and up in to the silicon plug 230 as it is formed.

The embodiments described above are provided to illustrate specific examples of processes that utilize the present invention. One skilled in the art will appreciate that there are many process sequences, materials, and expedients that are useful for practicing the present invention. The present invention is not to be construed as limited to the illustrative embodiments, except as is consistent with the appended claims.

What is claimed is:

1. A process for fabricating a vertical transistor comprising:

forming a first device region selected from the group consisting of a source region and a drain region of a semiconductor device in a semiconductor substrate;

forming at least three layers of material over the first device region in the semiconductor substrate wherein the second layer is interposed between the first and the third layers;

forming a window in the at least three layers of material, wherein the window terminates at the first device region formed in the semiconductor substrate;

filling the window with a semiconductor material thereby forming a semiconductor plug in the at least three layers of material, wherein the plug has a first end and a second end and wherein the first end is in contact with the first device region;

forming a second device region selected from the group consisting of a source region and a drain region in the second end of the silicon plug, wherein one of the first and second device regions is a source region and the other is a drain region;

removing a portion of the third layer, thereby exposing the second layer underlying the removed portion of the third layer;

removing the second layer, thereby exposing a portion of the semiconductor plug;

forming a layer of dielectric material on the exposed portion of the semiconductor plug;

forming a gate in contact with the layer of dielectric material.

2. The process of claim 1 wherein the second layer is removed by etching in an etchant, wherein the first layer has a first etch rate, the second layer has a second etch rate, and the third layer has a third etch rate in an etchant, and wherein the second etch rate is at least ten times faster than the first etch rate and the third etch rate in the etchant.

3. The process of claim 2 wherein the etchant is selected from the group consisting of isotropic wet etchants and isotropic dry etchants.

4. The process of claim 2 wherein the first layer and the third layer are made of an electrically insulating material.

5. The process of claim 4 wherein the electrically insulating material is selected from silicon nitride, silicon dioxide, and doped silicon dioxide.

6. The process of claim 5 wherein the electrically insulating material is doped silicon dioxide that is a dopant source for a source extension and a drain extension and wherein the process further comprises doping the semiconductor plug with dopant from the first layer and the third layer to form source and drain extensions in the semiconductor plug.

7. The process of claim 6 wherein the type of dopant in the doped silicon dioxide is selected from the group consisting of n-type and p-type and wherein the dopant is opposite the dopant type in the semiconductor plug.

8. The process of claim 1 wherein the semiconductor plug is a doped semiconductor plug and wherein the dopant is selected from the group consisting of n-type dopants and p-type dopants.

9. The process of claim 8 wherein the doped semiconductor plug is formed by introducing the dopant into the semiconductor material in situ as the semiconductor material is deposited in the window.

10. The process of claim 8 wherein the doped semiconductor plug is formed by implanting the dopant into the semiconductor material after it is deposited in the window.

11. The process of claim 8 wherein the semiconductor material is a crystalline semiconductor material and is selected from the group consisting of silicon, silicon-germanium, and silicon-germanium-carbon.

12. The process of claim 1 further comprising forming an etch stop layer over either the first layer of material, the second layer of material, or both the first and second layers of material.

13. The process of claim 1 further comprising forming a diffusion barrier layer over the first device region before the at least three layers of material are formed thereover.

14. The process of claim 1 further comprising forming a layer of thermal oxide on the exposed portion of the semiconductor plug, removing the layer of thermal oxide, and then forming the layer of dielectric material on the exposed portion of the semiconductor plug.

15. The process of claim 1 wherein the substrate is selected from the group consisting of silicon substrates and silicon on insulator substrates.

16. The process of claim 1 wherein the layer of dielectric material is formed on the semiconductor plug by heating the substrate to a temperature in the range of about 700° C. to about 1100° C. in-an oxygen-containing atmosphere.

17. The process of claim 1 wherein the layer of dielectric material is formed on the semiconductor plug by chemical vapor deposition.

18. The process of claim 1 wherein the layer of dielectric material is formed on the semiconductor plug by atomic layer deposition.

19. The process of claim 1 wherein the layer of dielectric material is formed on the semiconductor plug by jet vapor deposition.

20. The process of claim 1 wherein the layer of dielectric material formed on the semiconductor plug is selected from the group consisting of silicon dioxide, silicon nitride, silicon oxynitride and metal oxides.

21. The process of claim 20 wherein the thickness of the layer of dielectric material formed on the semiconductor plug is about 1 nm to about 20 nm.

22. The process of claim 1 wherein the second layer is removed by etching in an etchant, wherein the semiconductor plug has a first etch rate, the second layer has a second etch rate, and wherein the second etch rate is at least ten times faster than the first etch rate in the etchant.

23. The process of claim 1 wherein the gate is a material selected from the group consisting of doped polycrystalline silicon, doped amorphous silicon, doped polycrystalline silicon-germanium, doped amorphous silicon-germanium, doped polycrystalline silicon-germanium-carbon, doped amorphous silicon-germanium-carbon, metals, and metal-containing compounds.

24. The process of claim 23 wherein the gate material is formed on the substrate by chemical vapor deposition, electroplating, or a combination thereof.

25. The process of claim 24 wherein the metals and metal-containing compounds are selected from the group consisting of titanium, titanium nitride, tungsten, tungsten silicide, tantalum, tantalum nitride, and molybdenum.

* * * * *